(12) United States Patent
Gunther et al.

(10) Patent No.: US 6,246,585 B1
(45) Date of Patent: Jun. 12, 2001

(54) CARD-HOLDING/LOCKING DEVICE FOR THE SECURING/LATCHING OF A PRINTED CIRCUIT CARD/BOARD

(75) Inventors: Hans-Ulrich Gunther, Pfinztal; Volker Haag, Bad Wildbad; Paul Mazura, Karlsbad; Klaus Pfeifer, Karlsruhe; Klaus-Michael Thalau, Malsch; Udo Weiss, Straubenhardt; Michael Joist, Gaggenau, all of (DE)

(73) Assignee: Schroff GmbH, Straubenhardt (DE)

( * ) Notice: Subject to any disclaimer, the term of this patent is extended or adjusted under 35 U.S.C. 154(b) by 0 days.

(21) Appl. No.: 09/209,195

(22) Filed: Dec. 10, 1998

(30) Foreign Application Priority Data

Dec. 11, 1997 (DE) .............................. 197 55 018

(51) Int. Cl.[7] ...................................... H05K 7/14
(52) U.S. Cl. ................... 361/759; 361/756; 361/801; 361/802; 439/377
(58) Field of Search .................... 361/752, 753, 361/754, 756, 759, 796, 797, 798, 801, 802; 439/157, 377, 491; 211/41.17

(56) References Cited

U.S. PATENT DOCUMENTS 3,216,580   11/1965   Fricker, Jr. .
3,829,741 * 8/1974   Athey ................................ 361/756
4,580,192 * 4/1986   Beun ................................. 361/736
5,302,133   4/1994   Tondreault .
5,467,254 * 11/1995  Brusati et al. ..................... 361/799
5,577,922 * 11/1996  Enomoto et al. ................... 439/157
5,751,558 * 5/1998   Gullicksrud et al. .............. 361/801

FOREIGN PATENT DOCUMENTS 0 097 228   1/1984   (EP) .
0 690 667   1/1996   (EP) .

OTHER PUBLICATIONS

German Disclosure Document, 5 pages (Oct. 23, 1961).
Hoffman–Schroff catalog, 3 pages (1996).

* cited by examiner

Primary Examiner—Jayprakash N. Gandhi
(74) Attorney, Agent, or Firm—Merchant & Gould P.C.

(57) ABSTRACT

A card-holding device for locking a printed circuit card in a guide rail of a subassembly/subrack includes a retaining element that is inserted in the guide rail at the front edge of a printing circuit card when the circuit card is inserted to retain the card. The retaining element swivels outward and away against the elastic restoring force of an activating element. The activating element is releasable from the retaining element to allow withdrawal of the printed circuit card.

17 Claims, 6 Drawing Sheets

CARD-HOLDING/LOCKING DEVICE FOR THE SECURING/LATCHING OF A PRINTED CIRCUIT CARD/BOARD

BACKGROUND OF THE INVENTION

The invention pertains to a card-holding device for the locking of a printed circuit card in a guide rail/rack of a subassembly/subrack or such, with a retaining element, that in case of a printed circuit card having been inserted into the guide rail lies in front of the front edge of the card and for withdrawing the printed circuit card can be swiveled out of the way against an elastic restoring force.

Printed circuit cards with electric or electronic components, which are mounted in subracks or other housings of the insertion technology, are normally guided on their longitudinal edges in guide rails, which makes it possible that they may simply be pushed into the subrack or the housing and pulled out again as needed.

Normally, the printed circuit card-holding devices are provided at their rear edge with plug and socket transfer connectors which establish the electrical connection with the subrack or the housing. Although the pinching effect of the plug and socket transfer connector, especially for multipole designs, holds the printed circuit cards in their inserted position, additional safety measures are required to hold the printed circuit card in its inserted position particularly for printed circuit cards not provided with a frontal plate piece and which, depending on the application, may be subjected to vibrations or irregular transverse accelerations. Separate card-holding devices serve this purpose.

A card-holding device of the type mentioned in the beginning is, e.g., known from the publication Hoffman/Schroff: "Katalog für die Elektronik 96/97" (Catalog for electronics), pages 37.46 and 37.47: The card-holding device depicted there includes as retaining element an elastically deformable safety latch (shackle) that as a matter of choice has to be swiveled out of the way either by hand (e.g., with the thumb) or with an in/out lifting handle to allow pulling the printed circuit card out. The safety latch is here part of a component mounted in front of the guide rail in the area of a front module rack of a subassembly/subrack.

The disadvantage of the known card-holding devices is noticeable on insertion (push-in) of a printed circuit card into its guide rails: Since the safety latch of such a card-holding device, due to the elastic restoring force acting on it, reverts (moves) back to its idle position, i.e. the latched (locked) position as soon as the printed circuit card is completely pulled out, it interferes appreciably with the insertion of the printed circuit card: The printed circuit card must then not only be introduced into its two guide rails, but additionally the safety latch of the card-holding device has to be swiveled out of the way against the elastic restoring force in order to allow the insertion of the printed circuit card at all. This process gets to be especially cumbersome if card-holding devices are mounted on both guide rails for the acceptance of the printed circuit card.

Starting with this state of the art, the invention is based on the objective to improve a card-holding device of the type mentioned at the beginning such that it is only activated if a printed circuit card has been inserted into the associated subassembly/subrack or housing; i.e. the card-holding device should not hinder the push-in (insertion), especially the feeding of a printed circuit card into the associated guide rails.

SUMMARY OF THE INVENTION

A card-holding device according to the invention for the securing of a printed circuit card in a guide rail of a subassembly/subrack or such contains, therefore, not only a retaining element that in case of a printed circuit card inserted in the guide rail is located in front of its front edge and can be swiveled out of the way against an elastic restoring force, but also an activating element that is elastically coupled with the retaining element and in case of an inserted printed circuit card inflicts upon it the elastic restoring force while it lies against a longitudinal edge of the inserted printed circuit card. In case of the printed circuit card having been removed (pulled out), the activating element is freely movable and the elastic restoring force onto the retaining element is eliminated.

The securing property of the card-holding device according to the invention is unchanged compared to the state of the art, but the disadvantages of the known card-holding devices described above are eliminated: The card-holding device according to the invention is automatically engaged by its activating element as soon as a printed circuit card is being inserted into the respective guide rail; however, if no printed circuit card is present in the associated guide rail, then the card-holding device according to the invention is inactive. Since the activating element in the latter case exerts no elastic restoring force onto the retaining element, the retaining element remains in the opened position; an insertion of a printed circuit card is problem-free and possible without interference by the retaining element.

Therefore, the invention makes available a card-holding device with alternately stable end positions, i.e. an open position of the retaining element and a latched position. The always stable final (end) position of the card-holding device is in each case created automatically by the insertion (push-in) or the withdrawal (pull-out) of a printed circuit card.

A preferred execution of the invention consists of the retaining element and the activating element having a common pivot point. It is here especially advantageous, if the retaining element and the activating element form a ductile rocker: The rear part of the rocker projects in case of an opened card-holding device beyond the insertion plane of the guide rail and is pressed down by a printed circuit card being pushed into the guide rail. By this, due to the elastic ductility of the rocker, a force is generated onto the proximal (front) part of the rocker—the retaining element—whereby it after the passing of the front edge of the printed circuit card snaps upward. Hence, according to this preferred design form of the invention, the retaining element and the activating element are made in one piece, where additional components like, e.g., springs, are eliminated for an elastic coupling between these parts. The mounting of the rocker on or in front of the guide rail occurs in a suitable manner with a bearing/support element that is fastened at the installation point and in which the rocker is supported at its pivot point.

Useful is an in/out lifting handle for the printed circuit card, with which the retaining element—with utilization of the laws of leverage (levers)—can be swiveled away from the front edge of the printed circuit card to make a withdrawal of the printed circuit card feasible. If the retaining element and the activating element of the invention are constructed as a rocker that is supported in a bearing element, it is advantageous if a first and preferably also a second push-off shoulder is provided for the in/out lifting handle, where the in/out lifting handle supports itself on the first push-off shoulder in order to facilitate the withdrawal of the printed circuit card, whereas it supports itself on the second push-off shoulder to aid the insertion of the printed circuit card.

The retaining element can be a safety latch, the construction (design) of which can be realized particularly simple.

The activating element can also be constructed as a shackle, and appropriately has a run-up ramp for the printed circuit card.

If the activating element structured as a shackle is part of a spring frame formed onto the retaining element, the card-holding device according to the invention can be especially advantageously realized: The retaining element may then possess the internal stability required for the securing (latching) effect, where the activating element constructed as a shackle (latch)—due to the elastic ductility of the spring frame—is elastically coupled with the retaining element. The such structured card-holding device can also be manufactured in one piece, e.g., as a die-cast plastic part. Furthermore, according to this preferred execution of the invention it is possible to fasten the activating element not directly at the pivot point, but to the retaining element and thereby indirectly couple it onto the pivot point, whereby the lever arm for the activating element structured as a shackle is advantageously lengthened.

When the printed circuit card is pulled out, the retaining element assumes advantageously a stable end position below the insertion plane of the guide rail so that any hindrance on insertion of the printed circuit card is eliminated.

BRIEF DESCRIPTION OF THE DRAWINGS

An example of execution of the invention is in the following further described on hand of the drawings. Depicted are by.

DETAILED DESCRIPTION OF THE PREFERRED EMBODIMENTS

Figure 1:
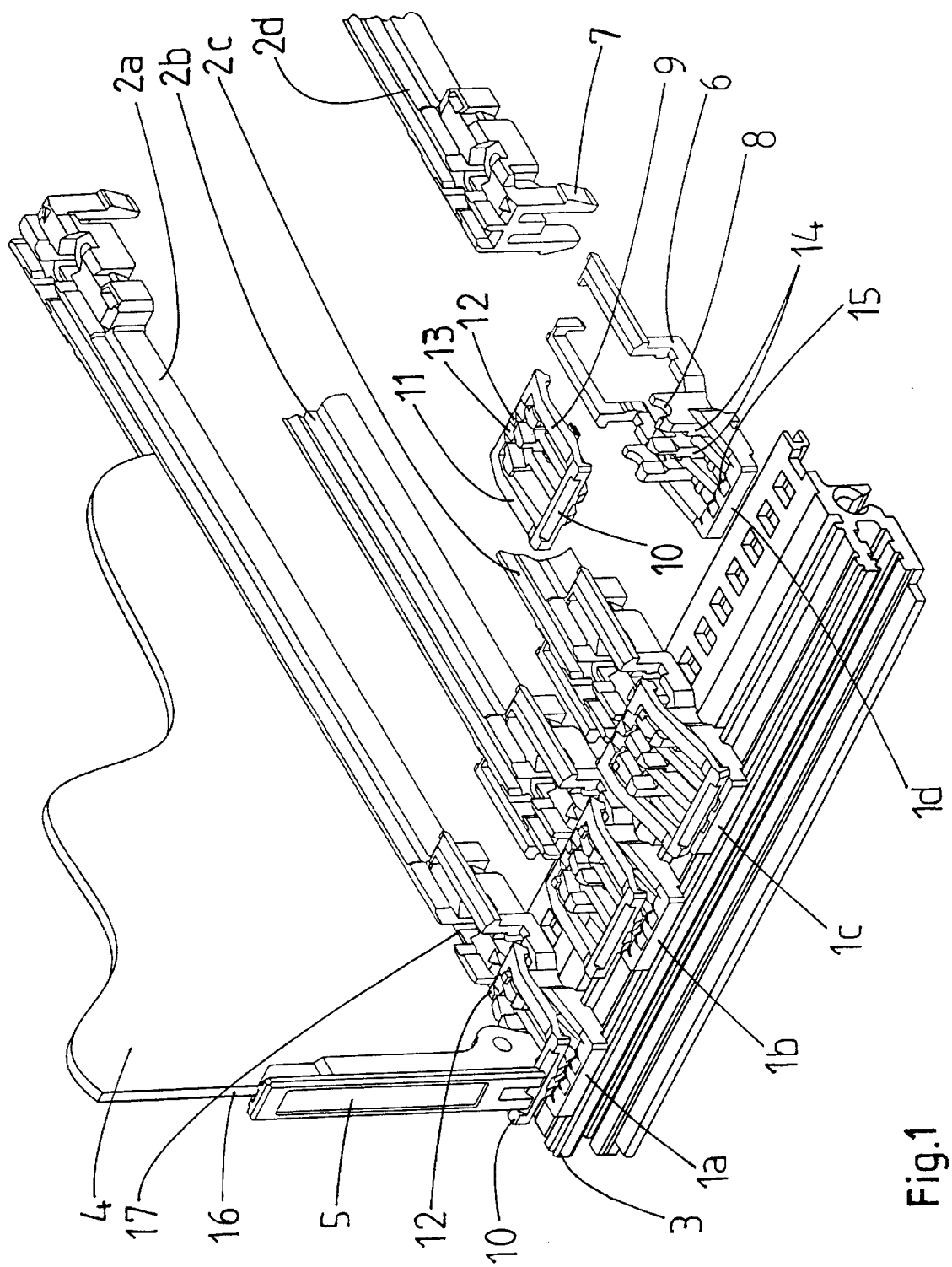
FIG. 1 a perspective part of a subassembly/subrack with four card-holding devices according to the invention.

FIG. 1 shows a perspective depiction of four card-holding devices according to the invention, 1a, 1b, 1c, 1d, which are fastened or can be fastened in front of associated guide rails 2a, 2b, 2c and 2d on a module track 3 of a (not depicted) subassembly/subrack.

The card-holding device 1a is shown in its securing position: A printed circuit card 4 sits in guide rail 2a with an in/out lifting handle 5 in completely inserted (pushed in} condition.

Next to card-holding device 1a is the card-holding device 1b situated for which, for a better view, the printed circuit card 4 with its in/out lifting handle 5 is not depicted. Therefore, the card-holding device 1b is shown in the identical position as the card-holding device 1a, i.e. in the securing position with inserted printed circuit card 4.

The card-holding device 1c shows its idle condition without a printed circuit card inserted in the guide rail 2c: This card-holding device 1c needs first still to be activated by a printed circuit card 4 that is to be pushed into the guide rail 2c.

The fourth depiction, the card-holding device 1d is intended to show its design; it is an exploded depiction of the card-holding device 1d and its associated guide rail 2d.

The Card-holding devices 1 depicted in FIG. 1 include each a bearing element 6 that together with the associated guide rail 2 through its (snapping) latch hook 7 can be fastened to the module rack 3. The bearing element 6 is provided with two bearing support bowls 8 for holding a rocker 9 that consists of a retaining element 10 in the form of a safety latch (shackle) and a spring frame 11 that is molded onto it and has a bow-shaped activating element 12. The activating element 12 contains a run-up ramp 13 for the printed circuit card 4, to ease its insertion into the guide rail 2. The bearing element 6 contains additionally first push-off shoulders 14, against which the in/out lifting handle 5 can support itself (push off) for the removal (pull-out) of the printed circuit card 4. Located opposite are second push-off shoulders 15, against which the in/out lifting handle 5 supports itself during the insertion (slide-in) of the printed circuit card 4.

FIG. 1 elucidates the way in which the card-holding device 1 according to the invention functions: The retaining element 10 of the card-holding device 1a stands, due to the elastic ductility of the spring frame 11 of the rocker 9, spring-loaded before the front edge 16 of the printed circuit card 4 and secures it against falling out. In order to allow the retaining element 10 to be swiveled out of the way with the aid of the in/out lifting handle 5 for the withdrawal of the printed circuit card 4, an elastic restoring force must be overcome, because the activating element 12 is prevented by the longitudinal edge 17 of the printed circuit card 4 to move upward.

However, as soon as the longitudinal edge 17 of the printed circuit card 4 no longer touches the activating element 12, the latter is freely movable around the pivot point situated in the bearing support bowl 8 and the rocker 9 can assume the end position shown for card-holding device 1c. Through suitable choice of the material of construction and dimensions of the rocker and the bearing element 6 can be achieved that the rocker 9, in case of withdrawn printed circuit card 4, assumes always the position of card-holding device 1c to not obstruct the insertion of the printed circuit card 4.

In each of the FIGS. 2, 3, 4, 5 and 6 is one printed circuit card 4 depicted with in/out lifting handle 5 that is being inserted in the guide rail 2 or withdrawn from it. The guide rail 2 is in each case sitting with the latch hook 7 in the module rack 3 and fixes here the bearing element 6, in whose bearing support bowl 8 sits an inner support part 18 of the rocker 9.

Figure 2:
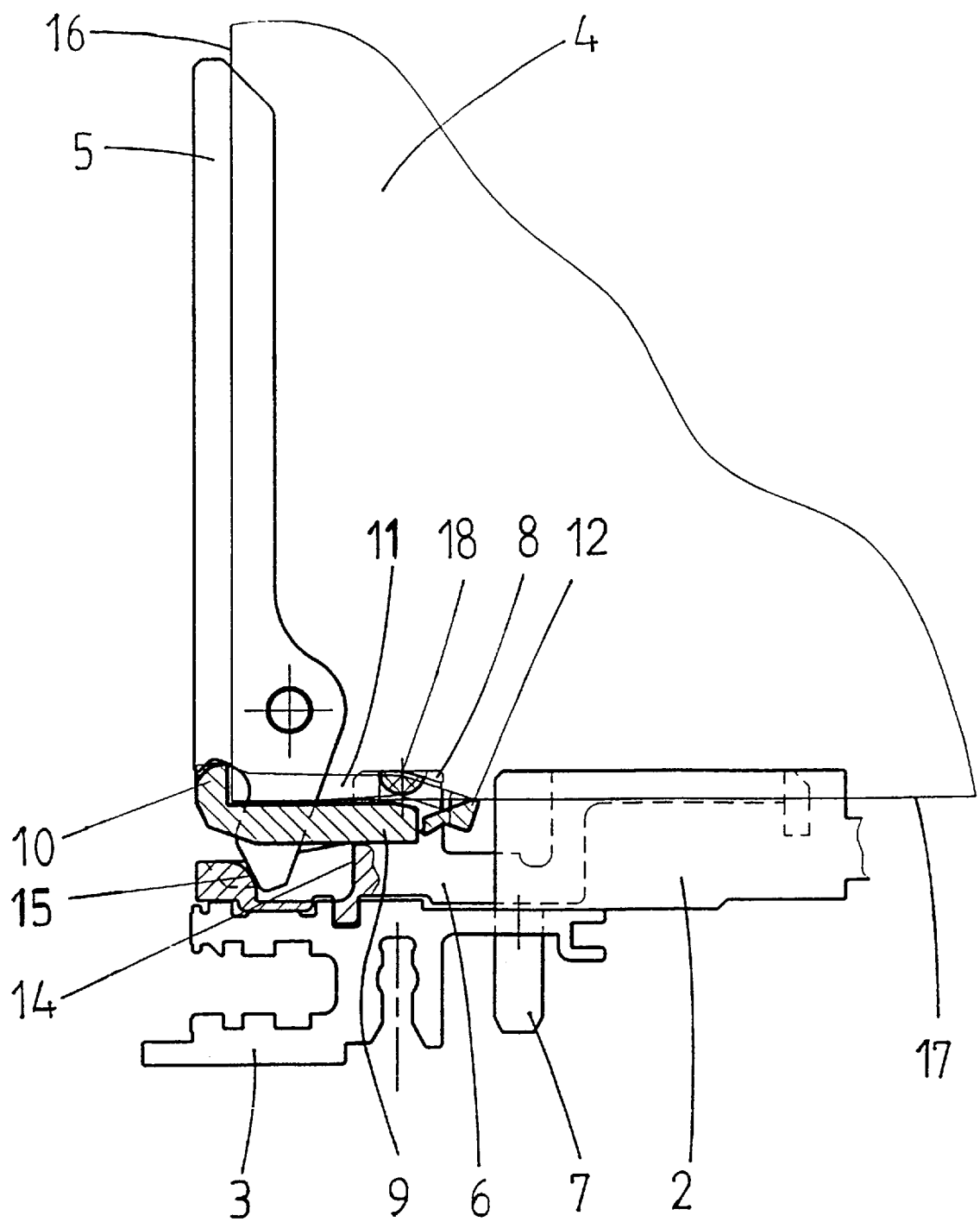
FIG. 2 a schematic sectional view of a card-holding device with an inserted printed circuit card.

FIG. 2 shows the card-holding device 1 with completely inserted printed circuit card 4; the in/out lifting handle 5 is located in its end position and supports itself against the second push-off shoulder 15 of the bearing element 6. The activating element 12 lies under slight initial stress (pretension) against the longitudinal edge 17 of the printed circuit card 17 of the printed circuit card 4. Since the activating element 12 is through the spring frame 11 elastically coupled with the retaining element 10, the latter sits, too, under slight initial stress (pre-tension) in securing position before the front edge 16 of the printed circuit card 4.

Figure 3:
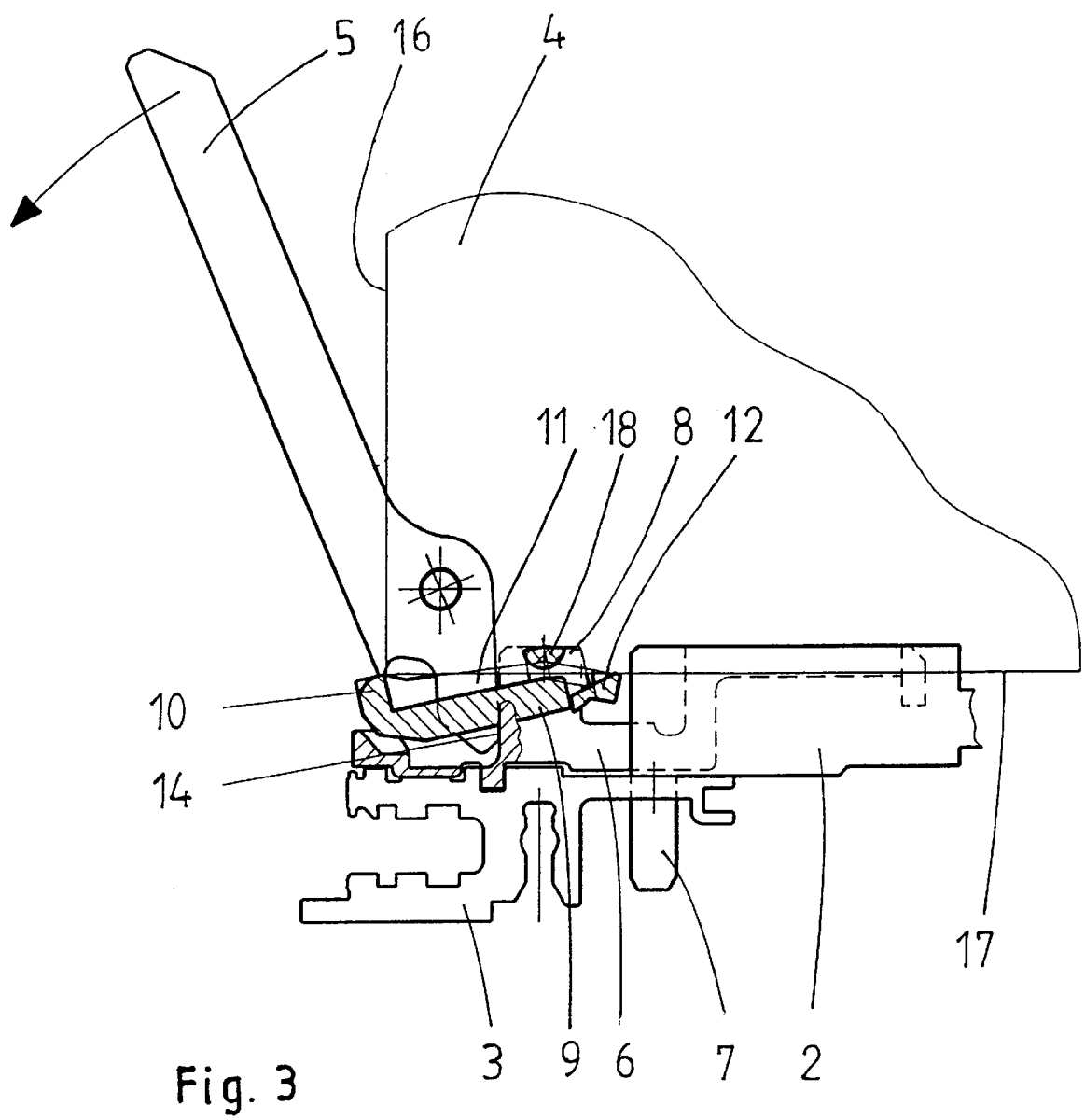
FIG. 3 a schematic sectional view of a card-holding device opened for the withdrawal of a printed circuit card.

FIG. 3 shows the beginning of the lift-out of the printed circuit card 4 by lever action: The in/out lifting handle 5 has been moved so that it now lies against the first push-off shoulder 14 of the bearing element 6—the withdrawal (pull-out) of the printed circuit card 4 can start. Through this first movement of the in/out lifting handle the retaining element 10 of the rocker 9 was pushed down so far that a withdrawal of the printed circuit card 4 is now possible. Because the activating element 12 continues to lie against the longitudinal edge 17 of the printed circuit card 4, the spring frame 11 of card-holding device 1 is now maximally pre-tensioned so that the retaining element 10 snaps immediately again in front of the front edge of the printed circuit card 4 if the in/out lifting handle is moved back again.

Figure 4:
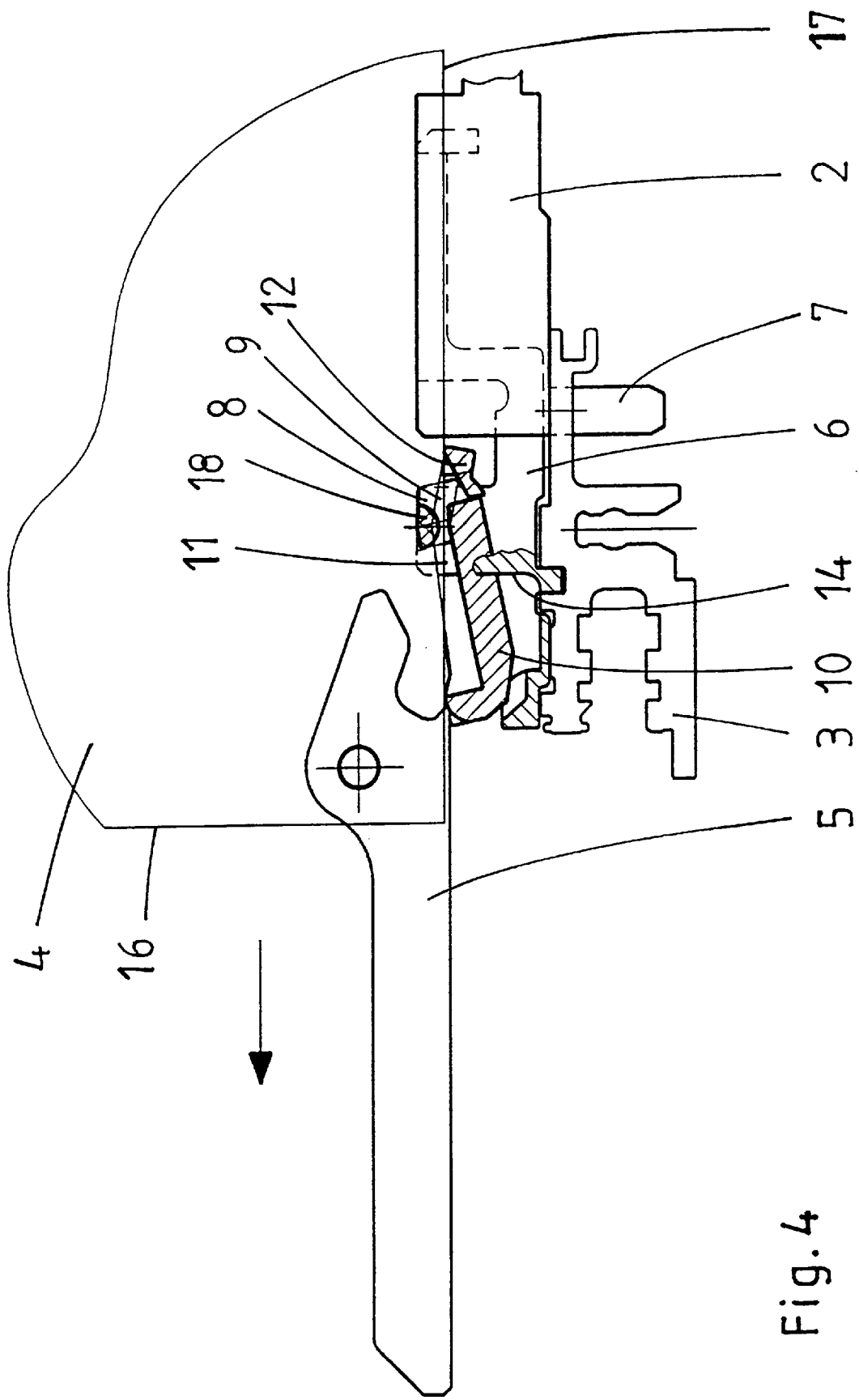
FIG. 4 a schematic sectional view of a card-holding device during the withdrawal of a printed circuit card.

FIG. 4 shows the withdrawal of the printed circuit card 4 from the guide rail 2. The deformation of the spring frame 11 of the rocker 9 and the positions of the retaining element 10 and the activating element 12 did not change compared to the point of time shown in FIG. 3.

Figure 5:
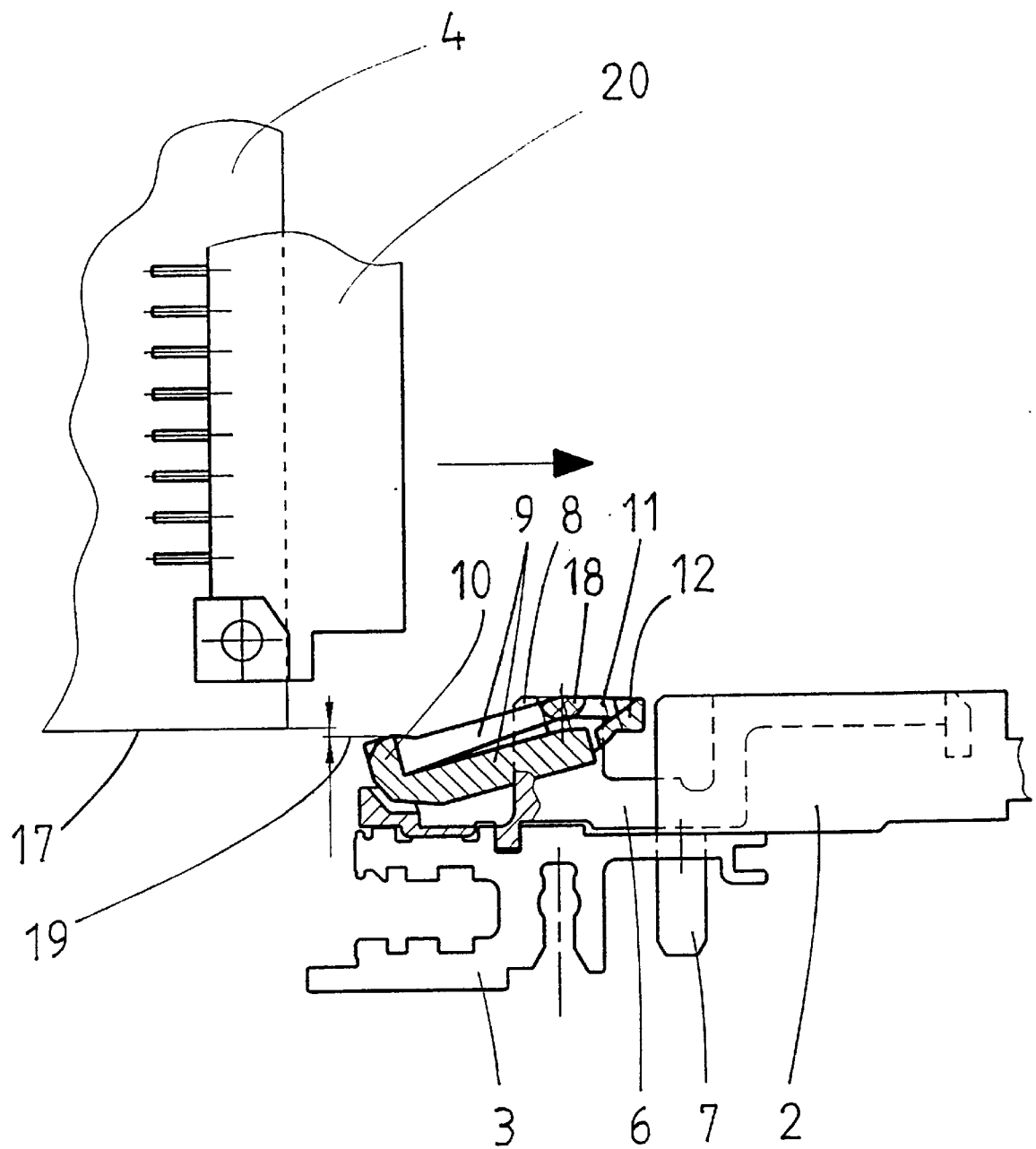
FIG. 5 a schematic sectional view of a card-holding device prior to the insertion of a printed circuit card.

As soon as the longitudinal edge 17 of the printed circuit card 4 passes the activating element 12, the latter will move upward to compensate for the deformation of the spring frame 11. This eliminates the elastic restoring force on the retaining element 10 so that it remains standing in its pushed-down position. This opened end position of the card-holding device 1 is depicted in FIG. 5. From FIG. 5 can also be seen that the stated idle position is chosen such that the retaining element 10 is positioned somewhat below the insertion plane 19 of the guide rail 2 so that the printed circuit card 4, of which here schematically also the rear plug-in connectors 20 are depicted, can be engaged (inserted) in guide rail 2 without interference by the card-holding device 1.

Figure 6:
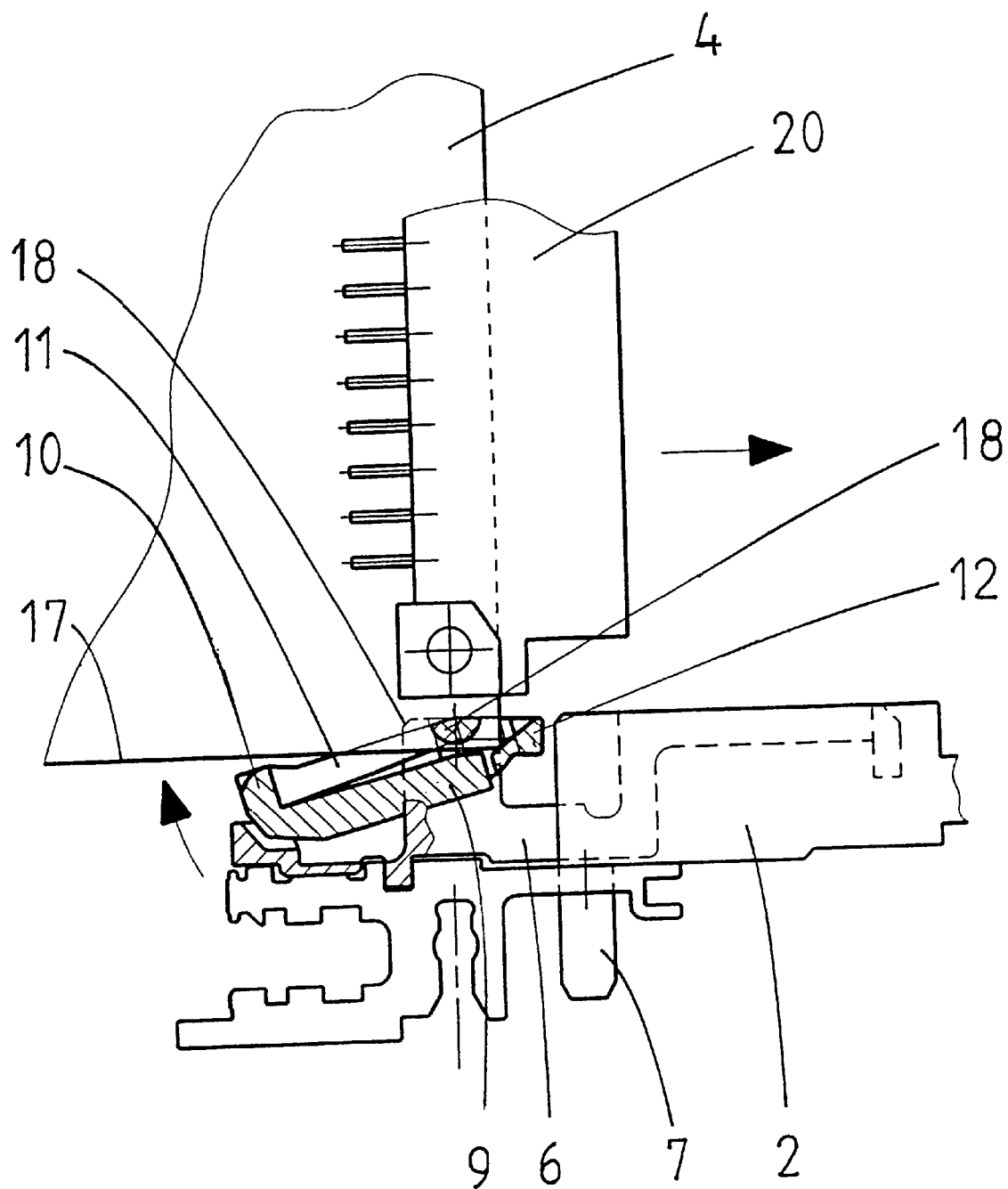
FIG. 6 a schematic sectional view of a card-holding device during the insertion of a printed circuit card.

FIG. 6 shows the point in time in the insertion of a printed circuit card 4 into the guide rail 2, when the printed circuit card 4 bumps into the activating element 12, depresses thereby the activating element 12 and creates through the spring frame 11 the initial stress (pre-tension) onto the retaining element 10 that after complete insertion of the printed circuit card 4 lets the retaining element 10 snap in front of the front edge 16 of printed circuit card 4.

| Summary of the reference designations | |
|---|---|
| 1 | card-holding device |
| 2 | guide rail |
| 3 | module rack |
| 4 | printed circuit card |
| 5 | in/out lifting handle |
| 6 | bearing element (of 1) |
| 7 | latch hook (of 2) |
| 8 | bearing support bowl |
| 9 | rocker |
| 10 | retaining element |
| 11 | spring frame |
| 12 | activating element |
| 13 | run-up ramp |
| 14 | push-off shoulder (first) |
| 15 | push-off shoulder (second) |
| 16 | front edge (of 4) |
| 17 | longitudinal edge (of 4) |
| 18 | inner bearing part |
| 19 | insertion plain |
| 20 | plug-in connector |

What is claimed is:

1. A card-holding device for the securing of a printed circuit card (4) in a guide rail (2) of a subassembly/subrack or such, with a retaining element (10), situated in front of a front edge (16) of the inserted printed circuit card (4), and for the purpose of withdrawing the printed circuit card (4), said retaining element (10) is adapted to be swiveled away against an elastic restoring force, wherein the card-holding device (1) comprises an activating element (12) elastically coupled to the retaining element (10); wherein the retaining element (10) and the activating element (12) have a common pivot point; and wherein said activating element (12) touches a longitudinal edge (17) of the inserted printed circuit card (4) and exerts an elastic restoring force onto the retaining element (10), but upon withdrawal of the printed circuit card (4), said activating element (12) is freely movable, whereby the elastic restoring force onto the retaining element (10) is then eliminated.

2. A card holding device according to claim 1, wherein the retaining element (10) and the activating element (12) form a rocker (9) that can be elastically deformed.

3. A card-holding device according to claim 2, further comprising a bearing element (6) that can be fastened on or ahead of the guide rail (2) is provided, where the rocker (9) is supported on its pivot point.

4. A card-holding device according to claim 3, wherein the bearing element (6) has a first push-off shoulder (14) for the in/out lifting handle.

5. A card-holding device according to claim 4, wherein the bearing element (6) has a second push-off shoulder (15) for the in/out lifting handle (5).

6. A card-holding device according to claim 1, wherein the retaining element (10) is a safety latch.

7. A card-holding device according to claim 1, wherein the activating element (12) is a bow.

8. A card-holding device according to claim 7, wherein the activating element (12) includes a run-up ramp (13) for the printed circuit card (4).

9. A card-holding device according to claim 7, wherein the activating element (12) in shape of a bow is part of a spring frame (11) formed onto the retaining element (10).

10. A card-holding device according to claim 1, wherein the retaining element (10) assumes a stable end position below an insertion plane (10) of the guide rail (2) upon withdrawal of a printed circuit card (4).

11. A card-holding device for the securing of a printed circuit card (4) in a guide rail (2) of a subassembly/subrack or such, with a retaining element (10), situated in front of a front edge (16) of the inserted printed circuit card (4), and for the purpose of withdrawing the printed circuit card (4), said retaining element (10) is adapted to be swiveled away against an elastic restoring force, wherein the card-holding device (1) comprises an activating element (12) elastically coupled to the retaining element (10); and wherein said activating element (12) touches a longitudinal edge (17) of the inserted printed circuit card (4) and exerts an elastic restoring force onto the retaining element (10), but upon withdrawal of the printed circuit card (4), said activating element (12) is freely movable, whereby the elastic restoring force onto the retaining element (10) is then eliminated; further comprising an in/out lifting handle (5) for the printed circuit card (4) with which the retaining element (10) can be swiveled away from the front edge (16) of the printed circuit card (4), utilizing the laws of levers.

12. A card holding device for retaining a card in a guide rail, the card having a front edge and a bottom edge, the device comprising:

a retainer mounted to an end of the guide rail adapted for retaining the card in the guide rail, wherein the retainer is movable between a first position wherein the retainer is adapted to engage the front edge of an inserted card, and a second position wherein the retainer is adapted to disengage the front edge of an inserted card;

a bearing member adapted to mount to the end of the guide rail, wherein the retainer pivots on the bearing member;

wherein the retainer moves to the second position when a card is withdrawn from the guide rail.

13. A card holding device according to claim 12, further comprising an actuator adapted to deform during insertion and withdrawal of the card from the guide rail, pivotally mounted to the retainer and adapted for engaging the lower edge of the card.

14. A card holding device according to claim 12, wherein the retainer is freely movable upon withdrawal of the card and flexed under tension when a card is inserted in the guide rail.

15. A card holding device according to claim 12, further comprising a lever pivotally connected to the retainer, wherein rotation of the lever in a first direction pivots the retainer away from the front edge of a card inserted in the guide rail.

16. A card holding device for retaining a card in a guide rail, the card having a front edge and a bottom edge, the device comprising:

a retainer mounted to an end of the guide rail adapted for retaining the card in the guide rail, wherein the retainer is movable between a first position wherein the retainer is adapted to engage the front edge of an inserted card, and a second position wherein the retainer is adapted to disengage the front edge of an inserted card; wherein the retainer further comprises a ramp portion adapted for receiving the lower edge of the card;

wherein the retainer moves to the second position when a card is withdrawn from the guide rail.

17. A card holding device for retaining a card in a guide rail, the card having a front edge and a bottom edge, the device comprising:

a retainer mounted to an end of the guide rail adapted for retaining the card in the guide rail, wherein the retainer is movable between a first position wherein the retainer is adapted to engage the front edge of an inserted card, and a second position wherein the retainer is adapted to disengage the front edge of an inserted card; wherein at the second position, the retainer is below the plane of the lower edge of a card inserted in a guide rails;

wherein the retainer moves to the second position when a card is withdrawn from the guide rail.

* * * * *